United States Patent
Reynolds et al.

(10) Patent No.: US 9,550,198 B2
(45) Date of Patent: Jan. 24, 2017

(54) ULTRAVIOLET ANGLED SPRAY NOZZLE

(75) Inventors: George H. Reynolds, Sanford, ME (US); James J. Foster, Wells, ME (US)

(73) Assignee: UNITED TECHNOLOGIES CORPORATION, Hartford, CT (US)

( * ) Notice: Subject to any disclaimer, the term of this patent is extended or adjusted under 35 U.S.C. 154(b) by 161 days.

(21) Appl. No.: 12/894,226

(22) Filed: Sep. 30, 2010

(65) Prior Publication Data
US 2012/0082790 A1  Apr. 5, 2012

(51) Int. Cl.
| | |
|---|---|
| B05B 7/06 | (2006.01) |
| B05B 3/00 | (2006.01) |
| B05B 1/28 | (2006.01) |
| B05B 13/04 | (2006.01) |
| F01D 5/28 | (2006.01) |
| F23C 7/00 | (2006.01) |
| F23R 3/14 | (2006.01) |
| C23C 8/04 | (2006.01) |
| C23C 10/04 | (2006.01) |
| C23C 14/04 | (2006.01) |
| C23C 24/00 | (2006.01) |
| B05D 1/32 | (2006.01) |

(52) U.S. Cl.
CPC .............. B05B 7/062 (2013.01); B05B 13/04 (2013.01); C23C 4/01 (2016.01); C23C 8/04 (2013.01); C23C 10/04 (2013.01); C23C 14/042 (2013.01); C23C 24/00 (2013.01); F01D 5/286 (2013.01); F23C 7/004 (2013.01); F23R 3/14 (2013.01); B05B 13/0431 (2013.01); B05D 1/322 (2013.01); F05D 2230/90 (2013.01); F23R 2900/00018 (2013.01)

(58) Field of Classification Search
USPC ............... 118/504, 505, 301, 721, 306, 317, 300,118/323, 313, 315; 427/259; 239/290, 295, 296
See application file for complete search history.

(56) References Cited

U.S. PATENT DOCUMENTS

| | | |
|---|---|---|
| 923,277 A | 6/1909 | Klinger |
| 982,661 A | 1/1911 | Dickens |
| 1,087,006 A | 2/1914 | Fitzsimmons |
| 1,637,908 A | 8/1927 | Lea |
| 1,832,724 A | 11/1931 | Mueller |
| 2,573,904 A | 11/1951 | Grossman |
| 2,647,796 A | 8/1953 | Ziherl |
| 2,759,766 A | 8/1956 | Thomas |

(Continued)

FOREIGN PATENT DOCUMENTS

| | | |
|---|---|---|
| DE | 2314348 A1 | 9/1974 |
| DE | 102004046351 A1 | 3/2006 |

(Continued)

OTHER PUBLICATIONS

EP Search Report mailed Jan. 23, 2012.

*Primary Examiner* — Yewebdar Tadesse
(74) *Attorney, Agent, or Firm* — Carlson, Gaskey & Olds, PC

(57) ABSTRACT

An apparatus for masking an article with masking material is disclosed. The apparatus generally includes a spray head connected to a primary channel which forms a passage for the masking material. This channel has two sections, the first of which terminates in a junction with the spray head and is angled from the second section. In addition, the apparatus has at least one secondary channel which forms an air passage and is attached to the primary angled channel.

13 Claims, 3 Drawing Sheets

(56) References Cited

U.S. PATENT DOCUMENTS

| | | | |
|---|---|---|---|
| 2,884,206 A | 4/1959 | Dukes | |
| 2,895,449 A * | 7/1959 | Oldfield, Jr. | 118/306 |
| 3,061,202 A | 10/1962 | Tyler | |
| 3,116,856 A | 1/1964 | Prussin et al. | |
| 3,475,039 A | 10/1969 | Ortloff | |
| 3,921,570 A * | 11/1975 | Hogstrom et al. | 118/685 |
| 3,955,763 A | 5/1976 | Pyle et al. | |
| 4,035,004 A | 7/1977 | Hengesbach | |
| 4,165,836 A | 8/1979 | Eull | |
| 4,241,646 A | 12/1980 | Tsuruta et al. | |
| 4,453,650 A | 6/1984 | Witte et al. | |
| 4,484,707 A | 11/1984 | Calder | |
| 4,635,850 A | 1/1987 | Leisi | |
| 4,800,913 A | 1/1989 | Nitzberg et al. | |
| 4,819,832 A | 4/1989 | Lawson | |
| 4,922,859 A | 5/1990 | Durell et al. | |
| 5,160,071 A | 11/1992 | Wright | |
| 5,507,534 A | 4/1996 | Reifenberger et al. | |
| 5,615,809 A | 4/1997 | Feer et al. | |
| 5,620,750 A | 4/1997 | Minoura et al. | |
| 5,622,056 A | 4/1997 | Utter | |
| 5,662,268 A | 9/1997 | Katzenberger | |
| 5,667,146 A | 9/1997 | Pimentel et al. | |
| 5,669,974 A | 9/1997 | Cueller et al. | |
| 5,722,830 A | 3/1998 | Brandhorst et al. | |
| 5,775,595 A | 7/1998 | Knodel et al. | |
| 5,988,530 A | 11/1999 | Rockefeller | |
| 6,415,956 B1 | 7/2002 | Havlovitz | |
| 6,439,241 B2 | 8/2002 | Berke et al. | |
| 6,443,332 B1 | 9/2002 | Costea | |
| 6,554,903 B1 * | 4/2003 | Sessa | B05B 15/0412 118/306 |
| 6,592,057 B1 | 7/2003 | Ericksen et al. | |
| 6,699,324 B1 * | 3/2004 | Berdin et al. | 118/306 |
| 6,732,958 B2 | 5/2004 | Norville et al. | |
| 6,746,535 B2 | 6/2004 | Hasenour et al. | |
| 6,872,337 B2 | 3/2005 | Mellentine et al. | |
| 7,040,551 B2 | 5/2006 | Rummel | |
| 2004/0025901 A1 | 2/2004 | Bergman et al. | |
| 2005/0175772 A1 * | 8/2005 | Worsham | B05B 5/03 427/165 |
| 2006/0286290 A1 * | 12/2006 | Wanthal et al. | 427/8 |
| 2008/0264542 A1 * | 10/2008 | Hawkins et al. | 152/510 |
| 2010/0136242 A1 * | 6/2010 | Kay | B05B 7/1486 427/427 |

FOREIGN PATENT DOCUMENTS

| | | |
|---|---|---|
| EP | 1925368 A2 | 5/2008 |
| EP | 2228136 A2 | 9/2010 |
| JP | 7237678 | 9/1995 |
| JP | 2000189857 | 7/2000 |

* cited by examiner

ULTRAVIOLET ANGLED SPRAY NOZZLE

BACKGROUND

This disclosure generally relates to an apparatus, a system, and a method for masking articles, and more particularly, to an apparatus, a system, and a method for masking articles of complex geometry not conducive to traditional spray masking.

Generally, it is known to mask and coat articles in order to protect them from degradation and wear during operation. Existing apparatuses dedicated to this task are limited by the geometry of the parts which they attempt to mask, since they typically have a sprayer connected directly and immovably to a large, blunt spraying mechanism. For this reason, it is difficult to mask parts with complex geometries prior to the coating process.

Specifically, high pressure compressor vanes are known to be exposed to extreme temperatures and pressures during the course of their operation. In order to reduce the amount of degradation and wear, the parts are typically coated with a protective material. The process of applying such a coating involves rapidly heating the material and accelerating the material at the part. This process can be damaging to the part and thus, masking with an ultraviolet (UV) curable material prior to coating is common practice.

During the masking process, a masking material is sprayed out of a central channel and air is sprayed out of at least one secondary channel. Combining the jet of air with the jet of masking material causes the atomization of the masking material, which improves the adhesion of the masking material to the substrate.

After the article has been masked, the coating material is heated and accelerated toward the partially-masked substrate. The masked surface is protected from the harsh effects of the coating process.

SUMMARY

An apparatus for masking an article with masking material is disclosed. The apparatus generally includes a spray head connected to a primary channel which forms a passage for the masking material. This channel has two portions: a first portion terminates in a junction with the spray head, and a second portion other terminates with a rotatable connection to an existing spraying machine. The first portion is angled from the second portion. In addition, the apparatus has at least one secondary channel which forms an air passage. The air passage is attached to the primary angled channel and at least one point along the length of the primary angled channel.

These and other features of the present disclosure can be best understood from the following specification and drawings, the following of which is a brief description.

DETAILED DESCRIPTION

Figure 1:
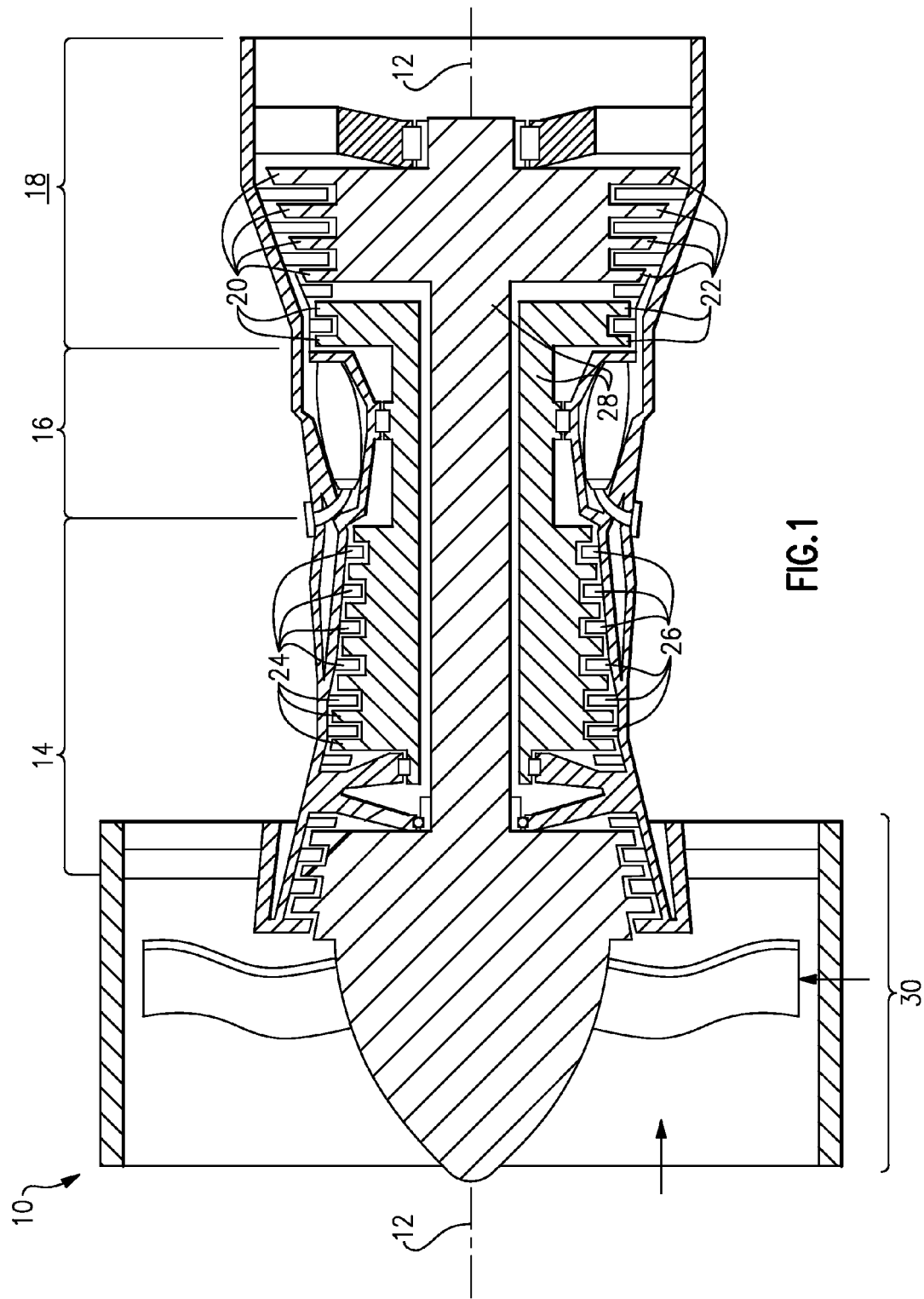
FIG. 1 is a sectional view of an axial flow, turbo fan gas turbine engine.

FIG. 1 illustrates a sectional view of an axial flow, turbo fan gas turbine engine 10 which comprises of a compressor section 14, a combustion section 16, a turbine section 18, and a fan 30. The turbine has rotating blades 22 which are fixed to rotors 28 which rotate about the centerline 12. In addition the turbine 18 has vanes 20, which remain fixed with respect to the blades 22. Similarly, the compressor 14 has vanes 26, and rotating blades 24 connected to a rotor 28 which rotates about the centerline 12.

Figure 2A:
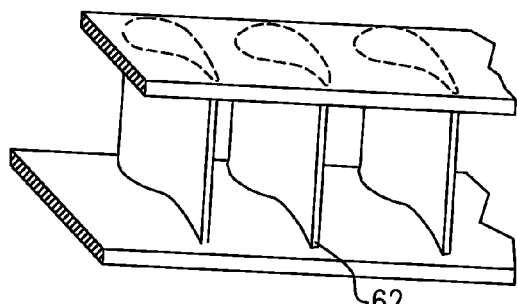
FIG. 2A is a perspective view of the airfoils in application to the vanes of a gas turbine engine.

FIG. 2A shows a perspective view of vanes 26. As shown, the vanes 26 are curved and nested within each other. Given such a closely-spaced orientation, it is difficult to apply a mask to the surfaces.

Figure 2C:
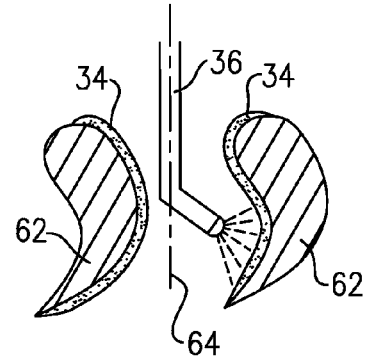
FIG. 2C is a side view of the interaction between an embodiment of the disclosure and a traditional compressor vane assembly.
Figure 2B:
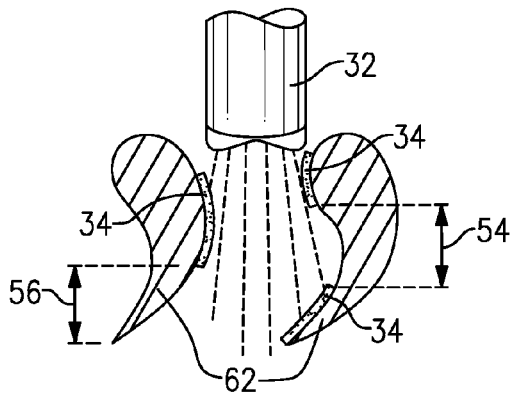
FIG. 2B is a perspective view of the interaction between a prior art sprayer and a traditional compressor vane assembly.

FIG. 2B shows the limitations of the prior art apparatus 32 for coating airfoils 62 such as the vanes 26 of a compressor 14. The prior art apparatus 32 can only partially mask section 34 of two airfoils 62 of relatively complex geometry in series. The remainder of the airfoils 62 remain unmasked, as seen by sections 54 and 56, since the prior art apparatus 32 cannot reach around the curved surfaces due to its existing geometry.

FIG. 2C shows the spray apparatus 36 of the disclosure which can fully mask 34 the complex geometry of the airfoils 62 in series. In contrast to FIG. 2A, the entire surface of the airfoils 62 is masked due to the spray apparatus's ability to rotate and translate about the axis 64. The spray apparatus may be configured to rotate and translate simultaneously, though the steps of rotating and translating the spray apparatus may be performed separately or in series.

Figure 2D:
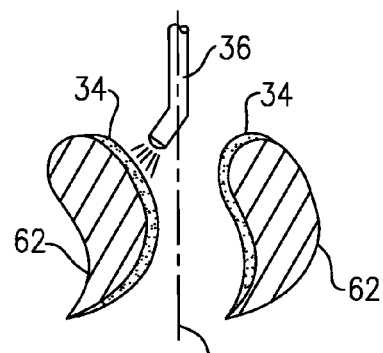
FIG. 2D is a side view of the interaction between the embodiment in FIG. 2C and a traditional compressor vane assembly in an alternate position.

FIG. 2D shows the spray apparatus 36 of the disclosure as in FIG. 2C in a secondary orientation. In this second orientation, the apparatus 36 has been rotated and translated about the vertical axis 64.

Figure 3A:
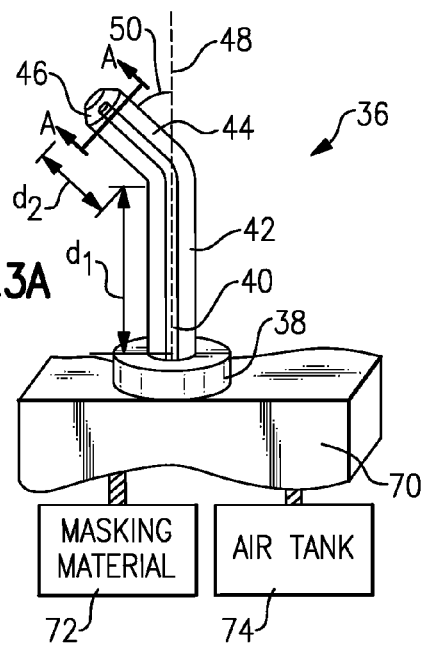
FIG. 3A is a side view of an embodiment of the apparatus.

FIG. 3A shows a side view of the spray apparatus 36 described in this disclosure. The apparatus 36 is rotatably attached to an existing spraying machine 70 and connected to the supply of masking material 72 and an air tank 74 by adapter 38. The supply of masking material 72 and the air tank 74 may be associated with an actuator capable of propelling masking material 72 through the channel 40, for example, while concurrently passing air through air channels 60. Alternatively, the supply of masking material 72 and the air tank 74 may be provided with separate, individual actuators capable of such concurrent operation.

The adapter 38 is connected to a longer second portion 42 of the apparatus, which is of length $d_1$. The second portion 42 is connected to a first portion 44, which is of length $d_2$, and is at an angle 50 from the centerline of the apparatus 48. In this embodiment, the angle 50 is approximately 45° and the ratio of $d_1$ to $d_2$ is substantially equal to 2:1. In other embodiments, the angle 50 can be between 35° and 145°, and the ratio of $d_1$ to $d_2$ can be approximately 2:1. The spray head 46 is secured to the termination of the first portion 44.

Additionally, the at least one channel 40 is secured and congruent to both the first portion 44 and second portion 42 of the apparatus 36.

Figure 3B:
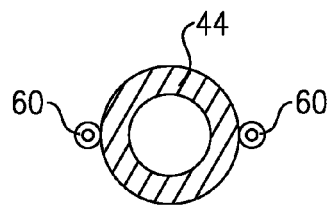
FIG. 3B is a section view of the nozzle and air channels taken from section A.

FIG. 3B shows a section view of the spray apparatus 36 taken from section A. The first portion 44 is surrounded by air channels 60. In this example there are two air channels 60, however in another embodiment there may be any number of air channels.

Figure 4:
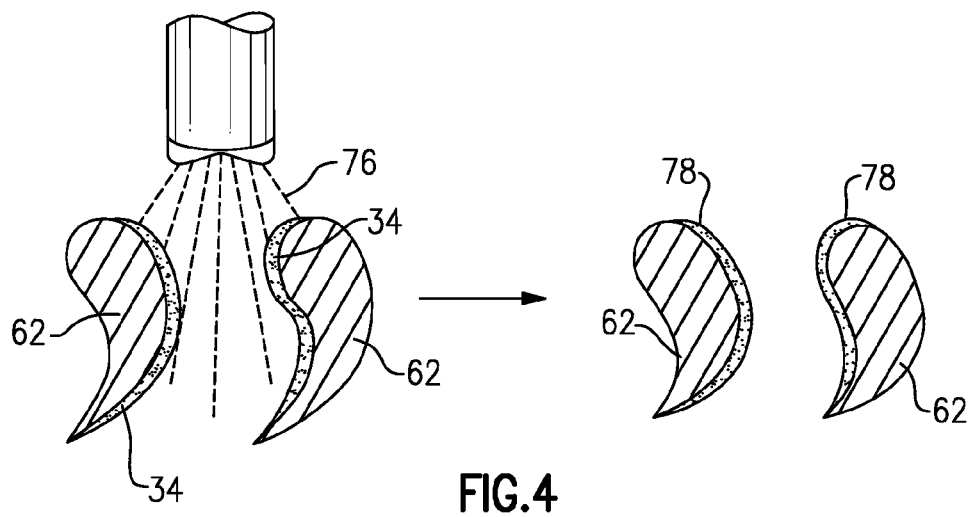
FIG. 4 is a pictorial illustration of the coating process following masking.

FIG. 4 illustrates the coating process that follows the masking process. The airfoils 62 have been previously coated with the masking material 34 and is then sprayed with the coating material 76 which has been heated in a plasma flame and accelerated at the airfoils 62 at a high velocity. During this process, the masking material 34 protects the coating 78 from directly contacting the airfoils.

Figure 5:
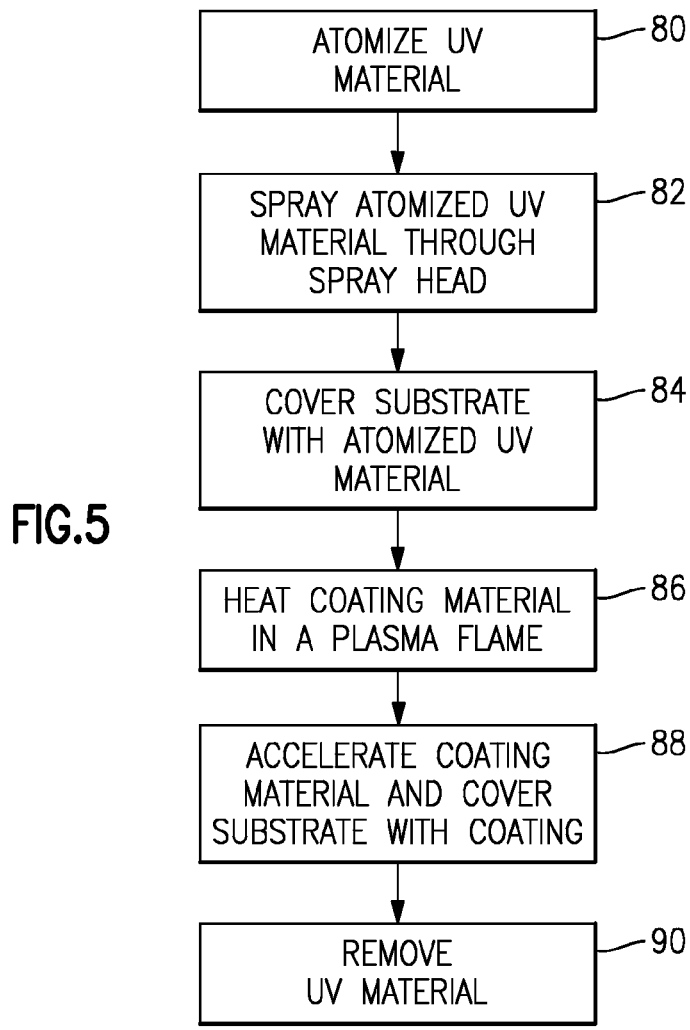
FIG. 5 is a method chart outlining the masking and coating processes.

FIG. 5 shows an outline of the process described in this application. First, the UV masking material is atomized at step 80. Next, at step 82, the atomized UV masking material is sprayed through the spray head, and then the airfoils (e.g., the articles or substrates) are covered with the atomized UV masking material at step 84. At step 86 the coating material is heated in a plasma flame, and is subsequently accelerated onto, and deposited onto, the masked airfoils as represented at step 88. Further, as represented at step 90, the atomized UV masking material may be removed from the airfoils through a heat treating process without detrimental effect to the coating material deposited in step 88. That is, the heat treating process removes the UV masking material without harming or removing the coating material. In one example, the temperatures associated with the heat treating process are no less than 600° F.

Although an embodiment has been disclosed, a worker of ordinary skill in this art would recognize that certain modifications would come within the scope of this disclosure. For this reason, the following claims should be studied to determine their true scope and content.

The invention claimed is:

1. An apparatus for masking an article with a masking material comprising:
   a spray head in communication with a primary channel forming a passage for said masking material, said primary channel having a first portion, which terminates in the spray head, and a second portion providing an entire remainder of said primary channel, the first portion angled from the second portion, wherein the second portion is longer than the first portion, and wherein a ratio of a length of the second portion to a length of the first portion is substantially equal to two to one, wherein the primary channel is provided by a single, continuous structure; and
   at least one secondary channel, forming an air passage, and attached to the first portion of the primary channel.

2. The apparatus as in claim 1, wherein an angle between the first portion and the second portion is within the range of 35° to 145° when measured from the longitudinal axis of the second portion to the center of the first portion.

3. The apparatus as in claim 2, wherein an angle between the first portion and the second portion is approximately 45°.

4. The apparatus as in claim 1, wherein the at least one secondary channel is configured such that a jet of air expelled from the at least one secondary channel would atomize masking material expelled from the primary channel.

5. The apparatus as in claim 1, wherein the masking material is an ultraviolet (UV) curable material.

6. The apparatus as in claim 1, wherein rotation and translation of the primary channel results in corresponding rotation and translation of the secondary channel.

7. A system for masking an article with a masking material comprising:
   a spray head in communication with a primary channel forming a passage for said masking material, said primary channel having a first portion, which terminates in the spray head, and a second portion providing an entire remainder of said primary channel, the first portion angled from the second portion, wherein the second portion is longer than the first portion, and wherein a ratio of a length of the second portion to a length of the first portion is substantially equal to two to one, wherein the primary channel is provided by a single, continuous structure;
   at least one secondary channel, forming an air passage, and attached to the first portion of the primary channel; and
   at least one actuator capable of propelling masking material through the primary channel and capable of passing air through the at least one secondary channel.

8. The system of claim 7, wherein the at least one actuator is capable of propelling masking material through the primary channel while concurrently passing air through the at least on secondary channel.

9. The system of claim 8, wherein the at least one actuator is a single actuator in communication with a supply of masking material and an air tank.

10. The system as in claim 7, wherein the angle between the first portion and the second portion is within the range of 35° to 145° when measured from the longitudinal axis of the second portion to the center of the first portion.

11. The system of claim 7, wherein the at least one secondary channel is configured such that a jet of air expelled from the at least one secondary channel atomizes the masking material expelled from the primary channel.

12. The system as in claim 7, wherein rotation and translation of the primary channel results in corresponding rotation and translation of the secondary channel.

13. The system as in claim 7, wherein the masking material is an ultraviolet (UV) curable material.

* * * * *